United States Patent
Takamoto et al.

(10) Patent No.: US 7,611,926 B2
(45) Date of Patent: Nov. 3, 2009

(54) THERMOSETTING DIE BONDING FILM (75) Inventors: Naohide Takamoto, Ibaraki (JP); Sadahito Misumi, Ibaraki (JP); Takeshi Matsumura, Ibaraki (JP); Yasuhiro Amano, Ibaraki (JP); Masami Oikawa, Kisarazu (JP); Tsubasa Miki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 47 days.

(21) Appl. No.: 12/040,775

(22) Filed: Feb. 29, 2008

(65) Prior Publication Data
US 2008/0213943 A1 Sep. 4, 2008

(30) Foreign Application Priority Data
Mar. 1, 2007 (JP) ............................. 2007-051762

(51) Int. Cl.
H01L 21/58 (2006.01)
H01L 23/14 (2006.01)

(52) U.S. Cl. .................. 438/118; 438/124; 438/126; 257/783; 257/E21.505

(58) Field of Classification Search .................. 438/118
See application file for complete search history.

(56) References Cited

U.S. PATENT DOCUMENTS

| 6,707,671 | B2 * | 3/2004 | Yamashita et al. | 361/704 |
| 6,784,541 | B2 * | 8/2004 | Eguchi et al. | 257/723 |
| 2004/0087062 | A1 * | 5/2004 | Ohuchi | 438/126 |
| 2004/0124544 | A1 * | 7/2004 | Kawai et al. | 257/783 |
| 2006/0226525 | A1 * | 10/2006 | Osuga et al. | 257/685 |
| 2006/0228562 | A1 * | 10/2006 | Ukawa et al. | 428/413 |

FOREIGN PATENT DOCUMENTS

| JP | 60-057342 | 4/1985 |
| JP | 2005-032961 | 2/2005 |
| JP | 2005-327789 | 11/2005 |
| JP | 2006-100784 | 4/2006 |
| JP | 2006-120725 | 5/2006 |
| JP | 2008-103700 | 5/2008 |

* cited by examiner

Primary Examiner—Stephen W Smoot
(74) Attorney, Agent, or Firm—Knobbe, Martens Olson & Bear LLP

(57) ABSTRACT

The thermosetting die bonding film of the invention is a thermosetting die bonding film used to produce a semiconductor device, which contains, as main components, 5 to 15% by weight of a thermoplastic resin component and 45 to 55% by weight of a thermosetting resin component, and has a melt viscosity of 400 Pa·s or more and 2500 Pa·s or less at 100° C. before the film is thermally set.

15 Claims, 2 Drawing Sheets

THERMOSETTING DIE BONDING FILM

This application claims priority to Japanese Patent Application No. JP 2007-051 762, filed Mar. 1, 2007. The above-referenced application is hereby expressly incorporated by reference in its entirety.

BACKGROUND OF THE INVENTION

1. Field of the Invention

The present invention relates to a thermosetting die bonding film, and a dicing die-bonding film having the same, more specifically, a thermosetting die bonding film used when a semiconductor chip or the like is die-bonded on an adherend such as a substrate or a lead frame, and a dicing die-bonding film having the same.

2. Background of the Invention

Conventionally, silver paste has been used to bond a semiconductor chip to a lead frame or an electrode member in the step of producing a semiconductor device. The treatment for the sticking is conducted by coating a paste-form adhesive on a die pad of a lead frame, or the like, mounting a semiconductor chip on the die pad, and then setting the paste-form adhesive layer.

However, about the paste-form adhesive, the amount of the coated adhesive, the shape of the coated adhesive, and on the like are largely varied in accordance with the viscosity behavior thereof, a deterioration thereof, and on the like. As a result, the thickness of the formed paste-form adhesive layer becomes uneven so that the reliability in strength of bonding a semiconductor chip is poor. In other words, if the amount of the paste-form adhesive coated on an electrode member is insufficient, the bonding strength between the electrode member and a semiconductor chip becomes low so that in a subsequent wire bonding step, the semiconductor chip is peeled. On the other hand, if the amount of the coated paste-form adhesive is too large, this adhesive flows out to stretch over the semiconductor chip so that the characteristic becomes poor. Thus, the yield or the reliability lowers. Such problems about the adhesion treatment become particularly remarkable with an increase in the size of semiconductor chips. It is therefore necessary to control the amount of the coated paste-form adhesive frequently. Thus, the workability or the productivity is deteriorated.

In this coating step of a paste-form adhesive, there is a method of coating the adhesive onto a lead frame or a forming chip by an independent operation. In this method, however, it is difficult to make the paste-form adhesive layer even. Moreover, an especial machine or a long time is required to coat the paste-form adhesive. Thus, a dicing die-bonding film which makes a semiconductor wafer to be bonded and held in a dicing step and further gives an adhesive layer, for bonding a chip, which is necessary for a mounting step is disclosed (see, for example, JP-A-60-57342).

This dicing die-bonding film has a structure wherein an adhesive layer and an adhesive layer are successively laminated on a supporting substrate. That is, a semiconductor wafer is diced in the state that the wafer is held on the adhesive layer, and then the supporting substrate is extended; the chipped works are peeled together with the adhesive layer; the peeled works are individually collected; and further the chipped works are bonded onto an adherend such as a lead frame through the adhesive layer.

In the meantime, an adhesive film for die bonding, which is used to bond a semiconductor chip, is, for example, a thermosetting film. As this thermosetting die bonding film, an adhesive film having a small melt viscosity is used in order to improve the adhesiveness of the film onto an adherend having largely differential levels on the basis of irregularity of its surface, typical examples of the adherend including a board having wiring thereon, and a semiconductor chip having wires thereon.

However, if the melt viscosity is too small, an adhesive oozes out from the adhesive film to result in a problem that the adhesive pollutes the substrate or the semiconductor chip. On the other hand, if the melt viscosity is too large, the adhesiveness of the film onto an adherend deteriorates to result in a problem that voids are generated.

SUMMARY OF THE INVENTION

The present invention has been made in light of the above-mentioned problems, and an object thereof is to provide a thermosetting die bonding film which is excellent in adhesiveness to adherends and does not generate pollution on a substrate or a semiconductor chip on the basis of an ooze of an adhesive, and a dicing die-bonding film having the same.

In order to solve the above-mentioned problems, the present inventors have made eager investigations on a thermosetting die bonding film, and a dicing die-bonding film having the same. As a result, the inventors find out that the above-mentioned object can be attained by adopting a configuration that will be described below, to complete the invention.

Accordingly, the thermosetting die bonding film of the invention is a thermosetting die bonding film used to produce a semiconductor device, which comprises, as main components, 5 to 15% by weight of a thermoplastic resin component and 45 to 55% by weight of a thermosetting resin component, and has a melt viscosity of 400 Pa·s or more and 2500 Pa·s or less at 100° C. before the film is thermally set.

According to the above-mentioned description, the lower limit of the amount of the thermoplastic resin component is set to 5% by weight, the upper limit of the amount of the thermosetting resin component is set to 55% by weight, and the melt viscosity of the die bonding film is set to 400 Pa·s or more at 100° C. before the film is thermally set, thereby making the adhesiveness onto an adherend, such as a substrate or a lead frame, preferable. As a result, the generation of voids can be decreased in the film surface bonded onto on the adherend such as a substrate or a lead frame. On the other hand, the upper limit of the amount of the thermoplastic resin component is set to 15% by weight, the lower limit of the amount of the thermosetting resin component is set to 45% by weight, and the melt viscosity is set to 2500 Pa·s or less, thereby making it possible that an ooze, from the die bonding film, of its adhesive component and the like is restrained. As a result, it is possible to prevent the pollution of a substrate, and a semiconductor chip bonded to this substrate.

The tensile storage modulus of the die bonding film is preferably 10 MPa or more at 250° C. after the film is thermally set. This makes it possible that, for example, even when wire bonding is applied to a semiconductor chip bonded on the thermosetting die bonding film, the generation of shearing deformation is prevented in the bonding face between the die bonding film and the adherend by ultrasonic vibration or heating. As a result, the success probability of the wire bonding is made high. Thus, semiconductor devices can be produced with a far higher yield.

It is preferred that the die bonding film has a moisture absorptivity of 1% by weight or less when the film is allowed to stand still in an atmosphere having a temperature of 85° C. and a relative humidity of 85% for 168 hours after heated so as to be thermally set. When the moisture absorptivity is set to 1% by weight or less, for example, the generation of a crack can be prevented in the semiconductor package in a reflow step.

The amount of the weight reduction of the die bonding film is preferably 1% by weight or less after the film is heated at 250° C. for 1 hour after heated so as to be thermally set. When the amount of the weight reduction is set to 1% by weight or less, for example, the generation of a crack can be prevented in the semiconductor package in a reflow step.

The dicing die-bonding film according to the invention is characterized in that the above-mentioned thermosetting die bonding film is laminated on an adhesive film in order to solve the above-mentioned problems.

The invention with the above means can provide the following advantages.

According to the thermosetting die bonding film of the invention, the film comprises, as main components, 5 to 15% by weight of a thermoplastic resin component and 45 to 55% by weight of a thermosetting resin component, and has a melt viscosity of 400 Pa·s or more and 2500 Pa·s or less at 100° C. before the film is thermally set, thereby improving the adhesiveness to an adherend to prevent the generation of voids. Additionally, an ooze of the adhesive component is restrained to prevent the pollution of a semiconductor chip or the like. As a result, semiconductor devices with high reliability can be produced with a good yield.

DESCRIPTION OF THE EMBODIMENTS

Thermosetting Die Bonding Film

The thermosetting die bonding film of the invention (referred to as the "die bonding film" hereinafter) will be described hereinafter.

The die bonding film contains, as main components, 5 to 15% by weight of a thermoplastic resin component and 45 to 55% by weight of a thermosetting resin component. The melt viscosity of the film is from 400 to 2500 Pa·s, preferably from 500 to 2000 Pa·s at 100° C. before the film is thermally set.

The lower limit of the amount of the thermoplastic resin component is set to 5% by weight and the upper limit of the amount of the thermosetting resin component is set to 55% by weight, thereby setting the melt viscosity of the adhesive film to 500 Pa·s or more at 100° C. before the film is thermally set. As a result, the adhesiveness of the die bonding film to an adherend can be made good. Additionally, the upper limit of the amount of the thermoplastic resin component is set to 15% by weight and the lower limit of the amount of the thermosetting resin component is set to 45% by weight, thereby setting the melt viscosity of the adhesive film to 2000 Pa·s or less. As a result, an ooze, from the die bonding film, of its adhesive component and on the like is restrained, so that the pollution of a substrate, a semiconductor chip and on the like can be prevented.

The tensile storage modulus of the die bonding film is preferably 10 MPa or greater, more preferably from 15 to 100 MPa at 250° C. after the film is thermally set. The tensile storage modulus may be adjusted by adjusting, for example, the amount of an inorganic filler to be added.

The moisture absorptivity of the die bonding film is preferably 1% by weight or less when the film is allowed to stand still in an atmosphere having a temperature of 85° C. and a relative humidity of 85% for 168 hours after heated so as to be thermally set. When the moisture absorptivity is set to 1% by weight or less, for example, the generation of a crack can be prevented in the semiconductor package in a reflow step. The moisture absorptivity may be adjusted by adjusting, for example, the amount of the inorganic filler to be added.

The amount of the weight reduction of the die bonding film is preferably 1% by weight or less after the film is heated at 250° C. for 1 hour after heated so as to be thermally set. When the amount of the weight reduction is set to 1% by weight or less, for example, the generation of a crack can be prevented in the semiconductor package in a reflow step. The amount of the weight reduction may be adjusted by adjusting, for example, the amount of the inorganic filler to be added.

The die bonding film according to the present embodiment made only of a single adhesive layer, and a multi-layered adhesive sheet wherein an adhesive layer or adhesive layers is/are formed on a single face or both faces of a core member. Examples of the core member include films (such as polyimide, polyester, polyethylene terephthalate, polyethylene naphthalate, and polycarbonate films); resin substrates which are reinforced with glass fiber or plastic nonwoven finer; silicon substrates; and glass substrates. The core member may be a member wherein an adhesive sheet is integrated with a dicing sheet.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In the present invention, die bonding film comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

In order to crosslink the die bonding film of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

An inorganic filler may be appropriately incorporated into the die bonding film of the present invention in accordance with the use purpose thereof. The incorporation of the inorganic filler makes it possible to confer electric conductance to the sheet, improve the thermal conductivity thereof, and adjust the elasticity. Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used. The average particle size of the inorganic filler is preferably from 0.1 to 80 μm.

The amount of the inorganic filler to be incorporated is preferably set into the range of 0 to 80 parts by weight (more preferably, 0 to 70 parts by weight) for 100 parts by weight of the organic resin components. When the tensile storage modulus is set to 10 MPa or more at 250° C. after the film is thermally set, the blended amount of the inorganic filler is set preferably to 10 parts by weight or more for 100 parts by weight of the organic resin components. When the tensile storage modulus is 100 MPa or less, the blended amount is set preferably to 100 parts by weight or less for 100 parts by weight of the organic resin components. When the amount of the weight reduction is set to 1% by weight or less, the blended amount of the inorganic filler is set preferably to an amount more than 0 part by weight for 100 parts by weight of the organic resin components.

If necessary, other additives besides the inorganic filler may be incorporated into the die bonding film of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

The thickness of the die bonding film (in the case that the film is a laminate, the total thickness thereof) is not particularly limited, and is, for example, from about 5 to 100 μm, preferably from about 5 to 50 μm.

Process for Producing a Semiconductor Device

Figure 1:
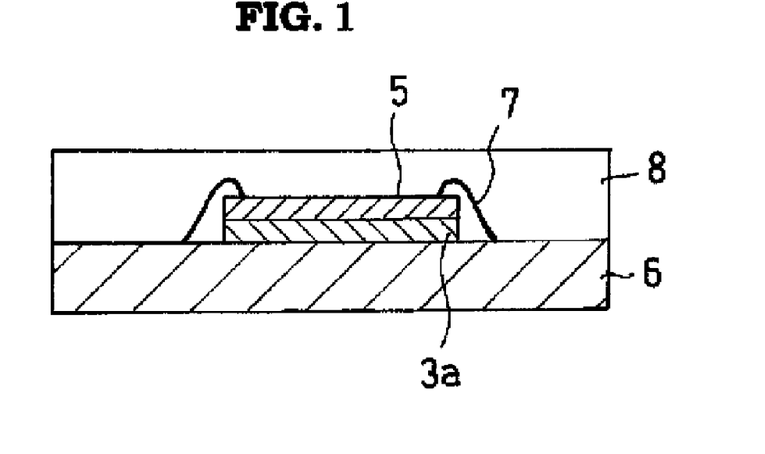
FIG. 1 is a schematic sectional view illustrating an example wherein a semiconductor chip is mounted through a die bonding film according to an embodiment of the invention.

The following will describe a process for producing a semiconductor device, using the die bonding film according to the present embodiment. FIG. 1 is a schematic sectional view illustrating an example wherein a semiconductor element is mounted through the die bonding film.

A method for producing the semiconductor device according to the present embodiment has a sticking/fixing step of sticking/fixing a semiconductor chip (semiconductor element) 5 onto a substrate or a lead frame (i.e., an adherend, which will be referred to merely as a "substrate or the like" hereinafter) 6 through a die bonding film 3a, and a wire bonding step of performing wire bonding by way of no heating step. Moreover the process further has a sealing step of sealing the semiconductor chip 5 with a sealing resin 8, and an after-curing step of after-curing the sealing resin 8.

As illustrated in FIG. 1, the sticking/fixing step is a step of sticking/fixing the semiconductor chip 5 onto the substrate or the like 6 through the die bonding film 3a. In this step, the die bonding film 3a is heated, thereby setting the film thermally so as to stick and fix the semiconductor chip 5 onto the adherend 6. In this way, the heat-resisting strength of the resultant is improved. About conditions for the heating, the temperature ranges from 80 to 180° C. and the heating time is from 0.1 to 24 hours, preferably from 0.1 to 4 hours, more preferably from 0.1 to 1 hour. The method for sticking/fixing the semiconductor chip 5 onto the substrate or the like 6 is, for example, a method of laminating the die bonding film 3a onto the substrate or the like 6, and then sticking/fixing the semiconductor chip 5 with laminating the semiconductor chip 5 on the die bonding film 3a so as to direct a wire bonding surface of the chip 5 upwards. A method of sticking/fixing the semiconductor chip 5 on which the die bonding film 3a is beforehand bonded onto the substrate or the like 6, thereby forming a laminate may be used.

In the invention, the die bonding film 3a may be merely bonded temporarily onto the adherend 6 without setting the film 3a thermally. In this case, thereafter, by way of no heating step, wire bonding is carried out, the semiconductor chip 5 is sealed with a sealing resin, and the sealing resin can be after-cured. The method of temporary sticking/fixing the semiconductor chip 5 onto the substrate or the like 6 is, for example, a method of laminating the die bonding film 3a onto the substrate or the like 6, and then sticking/fixing the semiconductor chip 5 with laminating the semiconductor chip 5 on the die bonding film 3a so as to direct a wire bonding surface of the chip 5 upwards. In addition, a method of temporary sticking/fixing the semiconductor chip 5 on which the die bonding film 3a is beforehand bonded temporarily onto the substrate or the like 6, thereby forming a laminate may be used.

The substrate may be any substrate known in the prior art. The lead frame may be a metal lead frame such as a Cu lead frame or a 42-alloy lead frame; or an organic substrate made of glass epoxy resin, BT (bismaleimide-triazine), polyimide or the like. In the present invention, however, the substrate is not limited to these substrates, and may be a circuit substrate that can be used in the state that a semiconductor element is mounted on the substrate itself and is electrically connected thereto.

The die bonding film 3a may be a die bonding film having a shearing adhesive strength of 0.2 MPa or more, preferably 0.2 to 10 MPa onto the substrate or the like 6 at the time of sticking/fixing temporarily the film 3a. The shearing adhesive strength of the die bonding film 3a is at least 0.2 Mpa or more; therefore, even if a wire bonding step is performed by way of no heating step, shearing deformation is not generated in the bonding face between the die bonding film 3a and the semiconductor chip 5 or the substrate or the like 6 by ultrasonic vibration or heating in the wire bonding step. In other words, the semiconductor element is not moved by ultrasonic vibration in the wire bonding step, thereby preventing a fall in the success probability of the wire bonding.

The wire bonding step is a step of connecting tips of terminal moieties (inner leads) of the substrate or the like 6 electrically with electrode pads (not illustrated) on the semiconductor chip 5 through bonding wires 7. The bonding wires 7 may be, for example, gold wires, aluminum wires, or copper wires. The temperature when the wire bonding is performed is from 80 to 250° C., preferably from 80 to 220° C. The heating time is from several seconds to several minutes. The connection of the wires is performed by using a combination of vibration energy based on ultrasonic waves with compression energy based on the application of pressure in the state that the wires are heated to a temperature in the above-mentioned range. In the case of the above-mentioned temporary sticking/fixing, the present step is carried out by way of no heating step.

The present step may be carried out without any sticking/fixing based on the die bonding film 3a. In this case, the semiconductor chip 5 is not bonded to the substrate or the like 6 through the die bonding film 3a in the process of the step. Here, even the temperature is in the range of 80 to 250° C., it is necessary that the shearing adhesive strength of the die bonding film 3a is 0.2 MPa or more. If the shearing adhesive strength is less than 0.2 MPa in the temperature range, the semiconductor element is moved by the ultrasonic vibration upon the wire bonding, so that the wire bonding cannot be carried out and the yield lowers.

The above-mentioned sealing step is a step of sealing the semiconductor element 13 with a sealing resin 15 (see FIG. 1(c)), and is performed to protect the semiconductor element 13 and the bonding wires 16 mounted on the substrate 11 or the like. The present step is performed by molding the sealing resin with a mold or die. The sealing resin 15 may be, for example, an epoxy resin. The heating for the resin-sealing is performed usually at 175° C. for 60 to 90 seconds. In the this invention, however, the heating is not limited to this, and may be performed, for example at 165 to 185° C. for several minutes. In such a way, the sealing resin is cured and further the semiconductor element 13 and the substrate 11 or the like are set to each other through the adhesive sheet 12. In this way, the sealing resin is cured. In addition thereto, in the case of the above-mentioned temporary sticking/fixing, the semiconductor chip 5 is bonded onto the substrate or the like 6 through the die bonding film 3a. In short, even if the post-curing step, which will be detailed later, is not performed in this invention, the sticking/fixing based on the adhesive sheet 12 can be attained in the present step so that the number of the producing steps can be reduced and the term for producing the semiconductor device can be shortened.

In the post-curing step, the sealing resin 15, which is not sufficiently cured in the sealing step, is completely cured. Even if the semiconductor element 13 and the substrate 11 or the like are not set to each other through the adhesive sheet 12 in the sealing step, the sealing resin 15 is cured and further they are set through the adhesive sheet 12 in the present step. The heating temperature in the present step is varied dependently on the kind of the sealing resin, and is, for example, in the range of 165 to 185° C. The heating time is from about 0.5 to 8 hours.

Figure 2:
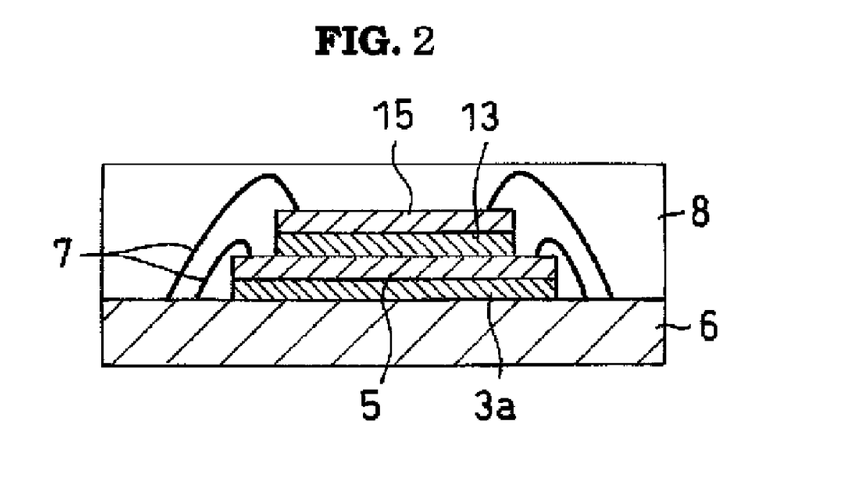
FIG. 2 is a schematic sectional view illustrating an example wherein semiconductor chips are three-dimensionally mounted through the die bonding film.

The dicing die-bonding film of the invention also can be preferably used in the case of three-dimensional mounting also in which plural semiconductor chips are laminated, as illustrated in FIG. 2. FIG. 2 is a schematic sectional view illustrating an example wherein semiconductor chips are three-dimensionally mounted through a die bonding film. In the case of the three-dimensional mounting illustrated in FIG. 2, at lest one die bonding film 3a cut out so as to have a size equal to that of a semiconductor chip 5 is bonded to a substrate or the like 6, and then the semiconductor chip 5 is bonded onto the substrate or the like 6 through the die bonding film 3a so as to direct its wire bonding face upwards. Next, a die bonding film 13 is bonded onto the semiconductor chip 5 avoiding its electrode pad portions. Furthermore, another semiconductor chip 15 is bonded onto the die bonding film 13 so as to direct its wire bonding face upwards. In this step, the die bonding films 3a and 13 are heated, thereby setting the films thermally to stick and fix the semiconductor chips. In this way, the heat-resisting strength of the resultant is improved. About conditions for the heating, the temperature preferably ranges from 80 to 200° C. and the heating time preferably ranges form 0.1 to 24 hours, which is the same as described above.

In the invention, the die bonding films 3a and 13 may be bonded temporarily without being thermally set. In this case, thereafter, wire bonding is carried out by way of no heating step, the semiconductor chips are sealed with a sealing resin, and the sealing resin can be after-cured.

Next, a wire bonding step is performed. In this way, individual electrode pads on the semiconductor chip 5 and the other semiconductor chip 15 are electrically connected with the substrate or the like 6 through bonding wires 7. In the case of the above-mentioned temporary bonding, the present step is carried out by way of no heating step.

Subsequently, a sealing step of sealing the semiconductor chip 5 and on the like with a sealing resin 8 is performed to cure the sealing resin. In addition thereto, in the case of the temporary sticking/fixing, the substrate or the like 6 and the semiconductor chip 5 are bonded to each other through the die bonding film 3a. Also, the semiconductor chip 5 and the other semiconductor chip 15 are bonded to each other through the die bonding film 13. After the sealing step, an after-curing step may be performed.

In the case of the three-dimensional mounting of the semiconductor chips, the production process is simplified and the yield is improved since heating treatment by heating the die bonding films 3a and 13 is not conducted. Furthermore, the substrate or the like 6 is not warped, and the semiconductor chips 5 and 15 are not cracked; thus, the semiconductor element can be made still thinner.

Figure 3:
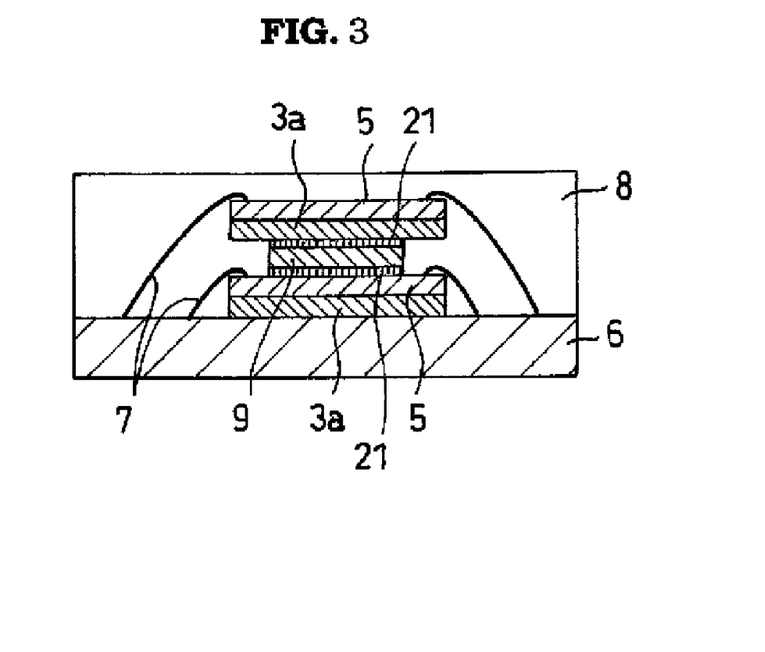
FIG. 3 is a schematic sectional view illustrating an example wherein the die bonding film is used to mount two semiconductor chips three-dimensionally so as to interpose a spacer therebetween.

Three-dimensional mounting may performed in which semiconductor chips are laminated through die bonding films so as to interpose a spacer between the semiconductor chips, as illustrated in FIG. 3. FIG. 3 is a schematic sectional view illustrating an example wherein two semiconductor chips are three-dimensionally mounted through die bonding films so as to interpose a spacer between the chips.

In the case of the three-dimensional mounting illustrated in FIG. 3, first, a die bonding film 3a, a semiconductor chip 5, and a die bonding film 21 are successively laminated on a substrate or the like 6 to bond these members. Furthermore, on the die bonding film 21 are successively laminated a spacer 9, another die bonding film 21, another die bonding film 3a, and another semiconductor chip 5 to bond these members. In this step, the die bonding films 3a and 21 are heated, thereby setting the films thermally to stick and fix the semiconductor chips and the spacer. In this way, the heat-resisting strength of the resultant is improved. About conditions for the heating, the temperature preferably ranges from 80 to 200° C. and the heating time preferably ranges form 0.1 to 24 hours, which is the same as described above.

In the invention, the die bonding films 3a and 21 may be bonded temporarily without being thermally set. In this case, thereafter, wire bonding is carried out by way of no heating step, the semiconductor chips are sealed with a sealing resin, and the sealing resin can be after-cured.

Next, as illustrated in FIG. 3, a wire bonding step is performed. In this way, electrode pads on the semiconductor chips 5 are electrically connected with the substrate or the like 6 through bonding wires 7. In the case of the above-mentioned temporary sticking/fixing, the present step is carried out by way of no heating step.

Subsequently, a sealing step of sealing the semiconductor chips 5 with a sealing resin 8 is performed to cure the sealing resin 8. In addition thereto, in the case of the above-mentioned temporary sticking/fixing, the substrate or the like 6 and one of the semiconductor chips 5 are bonded to each other, and the semiconductor chips 5 and the spacer 9 are bonded to each other through the die bonding films 3a and 21. In this way, a semiconductor package is obtained. The sealing step is preferably performed by a package sealing method wherein only the semiconductor chip 5 is sealed. The sealing is performed to protect the semiconductor chips 5 adhered onto the adhesive sheet(s). The method therefor is typically a method of using the sealing resin 8 and molding the resin 8 in a metal mold. At this time, it is general to use a metal mold composed of an upper metal mold part and a lower metal mold part and having plural cavities to seal simultaneously. The heating temperature at the time of the sealing preferably ranges, for example, from 170 to 180° C. After the sealing step, an after-curing step may be performed.

The spacer 9 is not particularly limited, and may be made of, for example, a silicone chip or polyimide film ant the like known in the prior art. The spacer may be a core member. The core member is not particularly limited, and may be a core member known in the prior art. Specific examples thereof include films (such as a polyimide film, a polyester film, a polyethylene terephthalate film, a polyethylene naphthalate film, a polycarbonate film and the like), resin substrates each reinforced with glass fiber or plastic nonwoven fiber, mirror silicon wafers, silicon substrates, and glass substrates.

Next, the resultant semiconductor package is surface-mounted on a printed wiring board. The method for the surface-mounting is, for example, reflow soldering, wherein a solder is beforehand supplied on the printed wiring board and then the solder is heated and melted with hot wind or the like so as to attain soldering. The method for the heating is, for example, hot wind reflow or infrared ray reflow or the like. The workpiece may be wholly or partially heated. The heating temperature is preferably from 240 to 265° C., and the time for the heating is preferably from 1 to 20 seconds.

Figure 4:
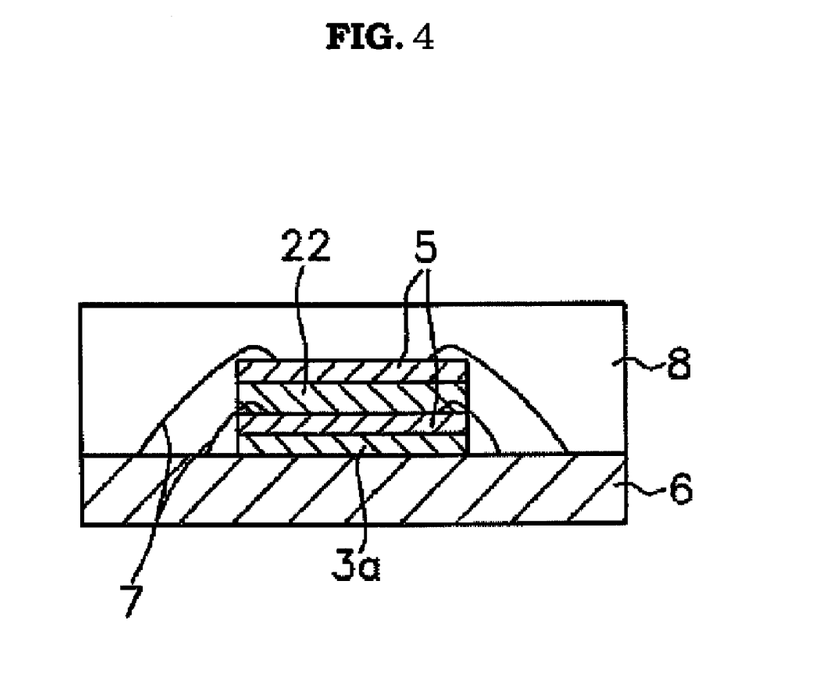
FIG. 4 is a schematic sectional view illustrating an example wherein the die bonding film is used to mount two semiconductor chips three-dimensionally without a spacer.

As illustrated in FIG. 4, without using the spacer 9, plural semiconductor chips 5 may be laminated through a die bonding film in which some parts of bonding wires are embedded to, thereby attain three-dimensional mounting (film-on-wire (FoW)). FIG. 4 is a schematic sectional view illustrating an example wherein two semiconductor chips are three-dimensionally mounted through die bonding films so as to interpose a spacer between the chips.

In the case of the three-dimensional mounting illustrated in FIG. 4, first, a die bonding film 3a and the semiconductor chips 5 are successively laminated on a substrate or the like 6 to bond the chip 5 to the substrate or the like 6. Next, without performing any heating step, a wire bonding step is performed as illustrated in FIG. 4. In this way, electrode pads on the semiconductor chips 5 are electrically connected to the substrate or the like 6 through the bonding wires 7.

Subsequently, the semiconductor chip 5 and the die bonding film 3a which are beforehand laminated on each other are laminated on the above-mentioned semiconductor chip 5 to bond this laminate and the chip onto each other. At this time, some parts of the bonding wires 7 are embedded in the die bonding film 22. Furthermore, a thermally setting step is performed to attain a wire bonding step.

Thereafter, a sealing step of sealing the semiconductor chips 5 with a sealing resin 8 is performed to cure the sealing resin 8, and further to bond the substrate or the like 6 and the semiconductor chips 5 to each other through the die bonding film 3a as well as to bond the semiconductor chips 5 to each other through the die bonding film 22. In this way, a semiconductor package is obtained. Conditions for the sealing step are the same as described above. In this embodiment also, an after-curing step may be also performed.

(Other Matters)

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

Below, preferred examples of the present invention are explained in detail. However, materials, addition amounts, and the like described in these examples are not intended to limit the scope of the present invention, and are only examples for explanation as long as there is no description of limitation in particular. In the examples, the word "part(s)" represent "part(s) by weight", respectively, unless otherwise specified.

EXAMPLE 1

Into methyl ethyl ketone were dissolved 100 parts by weight of an acrylic acid ester polymer made mainly of ethyl acrylate-methyl methacrylate (PARACRON W-197CM, manufactured by Negami Chemical Industrial Co., Ltd.), 228 parts by weight of an epoxy resin 1 (Epikote 1004, manufactured by Japan Environment Research Corporation), 206 parts by weight of an epoxy resin 2 (Epikote 827, manufactured by Japan Environment Research Corporation), 466 parts by weight of a phenol resin (REMIX [transliteration] XLC-4L, manufactured by Mitsui Chemicals), 667 parts by weight of a spherical silica (SO-25R, manufactured by ADMATECHS CO., LTD) having an average particle diameter of 0.5 μm, and 3 parts by weight of a curing catalyst (C11-Z, manufactured by SHIKOKU CHEMICALS CORPORATION), so as to prepare an adhesive composition having a concentration of 23.6% by weight.

This adhesive composition solution was applied onto a release-treated film made of a polyethylene terephthalate film (thickness: 50 μm) treated for release with silicone as a releasing liner. The resultant was then dried at 130° C. for 2 minutes to form a die bonding film A having a 40 μm of thickness according to Example 1.

EXAMPLE 2

Into methyl ethyl ketone were dissolved 100 parts by weight of an acrylic acid ester polymer made mainly of ethyl acrylate-methyl methacrylate (PARACRON W-197CM, manufactured by Negami Chemical Industrial Co., Ltd.), 144 parts by weight of an epoxy resin 1 (Epikote 1004, manufactured by Japan Environment Research Corporation), 130 parts by weight of an epoxy resin 2 (Epikote 827, manufactured by Japan Environment Research Corporation), 293 parts by weight of a phenol resin (REMIX [transliteration] XLC-4L, manufactured by Mitsui Chemicals), 444 parts by weight of a spherical silica (SO-25R, manufactured by ADMATECHS CO., LTD) having an average particle diameter of 0.5 μm, and 2 parts by weight of a curing catalyst (C11-Z, manufactured by SHIKOKU CHEMICALS CORPORATION), so as to prepare an adhesive composition having a concentration of 23.6% by weight.

This adhesive composition solution was applied onto a release-treated film made of a polyethylene terephthalate film (thickness: 50 μm) treated for release with silicone as a releasing liner. The resultant was then dried at 130° C. for 2 minutes to form a die bonding film B having a 40 μm of thickness according to Example 1.

EXAMPLE 3

Into methyl ethyl ketone were dissolved 100 parts by weight of an acrylic acid ester polymer made mainly of ethyl acrylate-methyl methacrylate (PARACRON W-197CM, manufactured by Negami Chemical Industrial Co., Ltd.), 101 parts by weight of an epoxy resin 1 (Epikote 1004, manufactured by Japan Environment Research Corporation), 92 parts by weight of an epoxy resin 2 (Epikote 827, manufactured by Japan Environment Research Corporation), 206 parts by weight of a phenol resin (REMIX [transliteration] XLC-4L, manufactured by Mitsui Chemicals), 333 parts by weight of a spherical silica (SO-25R, manufactured by ADMATECHS CO., LTD) having an average particle diameter of 0.5 μm, and 1.5 parts by weight of a curing catalyst (C11-Z, manufactured by SHIKOKU CHEMICALS CORPORATION), so as to prepare an adhesive composition having a concentration of 23.6% by weight.

This adhesive composition solution was applied onto a release-treated film made of a polyethylene terephthalate film (thickness: 50 μm) treated for release with silicone as a releasing liner. The resultant was then dried at 130° C. for 2 minutes to form a die bonding film C having a 40 μm of thickness according to Example 1.

EXAMPLE 4

Into methyl ethyl ketone were dissolved 100 parts by weight of an acrylic acid ester polymer made mainly of ethyl acrylate-methyl methacrylate (PARACRON W-197CM, manufactured by Negami Chemical Industrial Co., Ltd.), 76 parts by weight of an epoxy resin 1 (Epikote 1004, manufactured by Japan Environment Research Corporation), 69 parts by weight of an epoxy resin 2 (Epikote 827, manufactured by Japan Environment Research Corporation), 155 parts by weight of a phenol resin (REMIX [transliteration] XLC-4L, manufactured by Mitsui Chemicals), 267 parts by weight of a spherical silica (SO-25R, manufactured by ADMATECHS CO., LTD) having an average particle diameter of 0.5 μm, and 1.2 parts by weight of a curing catalyst (C11-Z, manufactured by SHIKOKU CHEMICALS CORPORATION), so as to prepare an adhesive composition having a concentration of 23.6% by weight.

This adhesive composition solution was applied onto a release-treated film made of a polyethylene terephthalate film (thickness: 50 μm) treated for release with silicone as a releasing liner. The resultant was then dried at 130° C. for 2 minutes to form a die bonding film D having a 40 μm of thickness according to Example 1.

COMPARATIVE EXAMPLE 1

Into methyl ethyl ketone were dissolved 100 parts by weight of an acrylic acid ester polymer made mainly of ethyl acrylate-methyl methacrylate (PARACRON W-197CM, manufactured by Negami Chemical Industrial Co., Ltd.), 482 parts by weight of an epoxy resin 1 (Epikote 1004, manufactured by Japan Environment Research Corporation), 436 parts by weight of an epoxy resin 2 (Epikote 827, manufactured by Japan Environment Research Corporation), 983 parts by weight of a phenol resin (REMIX [transliteration] XLC-4L, manufactured by Mitsui Chemicals), 1333 parts by weight of a spherical silica (SO-25R, manufactured by ADMATECHS CO., LTD) having an average particle diameter of 0.5 μm, and 6 parts by weight of a curing catalyst (C11-Z, manufactured by SHIKOKU CHEMICALS CORPORATION), so as to prepare an adhesive composition having a concentration of 23.6% by weight.

This adhesive composition solution was applied onto a release-treated film made of a polyethylene terephthalate film (thickness: 50 μm) treated for release with silicone as a releasing liner. The resultant was then dried at 130° C. for 2 minutes to form a die bonding film E having a 40 μm of thickness according to Example 1.

COMPARATIVE EXAMPLE 2

Into methyl ethyl ketone were dissolved 100 parts by weight of an acrylic acid ester polymer made mainly of ethyl acrylate-methyl methacrylate (PARACRON W-197CM, manufactured by Negami Chemical Industrial Co., Ltd.), 59 parts by weight of an epoxy resin 1 (Epikote 1004, manufactured by Japan Environment Research Corporation), 53 parts by weight of an epoxy resin 2 (Epikote 827, manufactured by Japan Environment Research Corporation), 121 parts by weight of a phenol resin (REMIX [transliteration] XLC-4L, manufactured by Mitsui Chemicals), 222 parts by weight of a spherical silica (SO-25R, manufactured by ADMATECHS CO., LTD) having an average particle diameter of 0.5 μm, and 1 parts by weight of a curing catalyst (C11-Z, manufactured by SHIKOKU CHEMICALS CORPORATION), so as to prepare an adhesive composition having a concentration of 23.6% by weight.

This adhesive composition solution was applied onto a release-treated film made of a polyethylene terephthalate film (thickness: 50 μm) treated for release with silicone as a releasing liner. The resultant was then dried at 130° C. for 2 minutes to form a die bonding film F having a 40 μm of thickness according to Example 1.

Melt Viscosity

The melt viscosity of each of the die bonding films A-F of Examples and Comparative Examples was measured at 100° C. before thermally set. A rheometer (RS-1, manufactured by Haake Co.) was used to make the measurement by a parallel plate process. Specifically, 0.1 g of sample was collected from each of the die bonding films A-F, and this sample was charged into a gap between plates heated to 100° C. in advance. The melt viscosity was defined as a value measured after 300 seconds from the start of the measurement. The gap between the plates was set to 0.1 mm. The results are shown in Tables 1 and 2 described below.

Void Area

Each of the die bonding films A-F of Examples and Comparative Examples was bonded onto a semiconductor element at 40° C., and then the resultant was mounted onto a BGA substrate at 160° C. and 0.2 MPa for 2 seconds. Next, the resultant was heated at 175° C. for 1 hour. In this way, each of the die bonding films A-F was thermally set.

Furthermore, each of the workpieces was packaged with a sealing resin (GE-100, manufactured by Nitto Denko Corporation) to produce a semiconductor device (a TFBGA package, 16×16×0.7 mm; chip size: 5×5 mm). The semiconductor device obtained after the sealing was cut with a glass cutter, and a cross section thereof was observed with a microscope. In this way, the area of voids in the bonding face between each of the die bonding films A-F and the BGA substrate was measured. The results are shown in Tables 1 and 2.

Ooze Amount of Each Adhesive

Each of the die bonding films A-F of Examples and Comparative Examples was bonded onto a semiconductor element at 40° C., and then the resultant was mounted onto a BGA substrate at 160° C. and 0.2 MPa for 2 seconds. The amount of the adhesive oozing at this time was measured with an optical microscope. The results are shown in Tables 1 and 2.

Measurement of Water Absorption

About each of the resultant die bonding films A-F, the water absorption after the film was thermally set was calculated from the weight reduction ratio thereof before and after the film was allowed to stand still for 168 hours in a thermostat having a temperature of 85° C. and a relative humidity of 85%.

Measurement of the Amount of Weight Reduction

About each of the resultant die bonding films A-F, the amount of weight reduction after the film was thermally set was calculated from the amount of weights thereof before and after the film was allowed to stand still at 210° C. for 1 hour in a drying machine.

Tensile Storage Modulus

About each of the resultant die bonding films A-F, the tensile storage modulus after the film was thermally set was measured at a temperature-raising rate of 10° C./minute and a frequency of 1 MHz, using a viscoelasticity measuring device (SOLID ANALYZER RSII, manufactured by Rheometic Scientific Co.).

Results

As is understood from Tables 1 and 2, in the die bonding film E of Comparative Example 1, wherein the melt viscosity was 300 Pa·s, the ooze amount of the adhesive was as large as 165 μm. In the die bonding film F of Comparative Example 2, wherein the melt viscosity was 3500 Pa·s, the void area after the packaging was as large as 8.9% by volume.

On the other hand, in the die bonding films A-D of Examples 1 to 4, wherein the melt viscosities were 500, 800, 1400, 2000 Pa·s, respectively, no adhesive oozed and further the void area after the packaging was also very small. From these results, it is understood that the die bonding films according to present Examples are excellent in adhesiveness to a semiconductor element, and do not pollute any substrate or semiconductor chip by an ooze of their adhesive in a die bonding step.

TABLE 1

|  | Example 1 Die bonding film A | Example 2 Die bonding film B | Example 3 Die bonding film C | Example 4 Die bonding film D |
| --- | --- | --- | --- | --- |
| Melt viscosity (Pa · s) | 500 | 800 | 1400 | 2000 |
| Void area (% by volume) | 1 or less | 1 or less | 1 or less | 3.0 |
| Ooze amount of adhesive (μm) | 50 or less | 50 or less | 50 or less | 50 or less |
| Tensile storage modulus (MPa) | 15 | 12 | 13 | 11 |
| Water absorption (% by weight) | 0.3 | 0.3 | 0.4 | 0.4 |
| Amount of weight reduction (% by weight) | 0.7 | 0.7 | 0.9 | 0.8 |

TABLE 2

|  | Comparative Example 1 Die bonding film E | Comparative Example 2 Die bonding film F |
| --- | --- | --- |
| Melt viscosity (Pa · s) | 300 | 3500 |
| Void area (% by volume) | 1 or less | 8.9 |
| Ooze amount of adhesive (μm) | 165 | 50 or less |
| Tensile storage modulus (MPa) | 25 | 8 |
| Water absorption (% by weight) | 0.3 | 0.6 |
| Amount of weight reduction (% by weight) | 0.5 | 1.0 |

What is claimed is:

1. A thermosetting die bonding film used to produce a semiconductor device,
   which comprises, as main components, 5 to 15% by weight of a thermoplastic resin component and 45 to 55% by weight of a thermosetting resin component, and
   has a melt viscosity of 400 Pa·s or more and 2500 Pa·s or less at 100° C. before the film is thermally set.

2. The thermosetting die bonding film according to claim 1, which has a tensile storage modulus of 10 MPa or more at 250° C. after the film is thermally set, 3. The thermosetting die bonding film according to claim 1, which has a moisture absorptivity of 1% by weight or less when the film is allowed to stand still in an atmosphere having a temperature of 85° C. and a relative humidity of 85% for 168 hours after heated so as to be thermally set.

4. The thermosetting die bonding film according to claim 1, which has a weight reduction ratio of 1% by weight or less after the film is heated at 250° C. for 1 hour after heated so as to be thermally set.

5. The thermosetting die bonding film according to claim 1, wherein an inorganic filler is contained in an amount that is more than 0 part by weight and is 80 parts or less by weight for 100 parts by weight of the organic resin components.

6. The thermosetting die bonding film according to claim 1, wherein the thermoplastic resin component is an acrylic resin component and the thermosetting resin component is made of an epoxy resin component and a phenol resin component.

7. The thermosetting die bonding film according to claim 6, wherein about the blend ratio between the epoxy resin component and the phenol resin component, the amount of hydroxyl groups in the phenol resin component is from 0.5 to 2.0 equivalents per equivalent of epoxy groups in the epoxy resin component.

8. The thermo setting die bonding film according to claim 7, wherein the blended amount of the epoxy resin component and the phenol resin component is from 10 to 200 parts by weight for 100 parts by weight of the acrylic resin component.

9. A dicing die-bonding film, wherein the thermosetting die bonding film according to claim 1 is laminated on an adhesive film.

10. The thermo setting die bonding film according to claim 1, further comprising a crosslinking agent in an amount of 0.05 to 7 parts by weight for 100 parts by weight of polymer.

11. A method for producing a semiconductor device, comprising:
   attaching a semiconductor element onto a substrate or a lead frame through the thermosetting die bonding film of claim 1;
   wire bonding the semiconductor element to electrode pads;
   sealing the semiconductor element with a sealing resin; and
   after-curing the sealing resin, wherein at least one of said attaching, wire bonding, sealing, and after-curing processes include heating sufficient to fix said semiconductor element to said substrate or lead frame by thermally setting the thermosetting die bonding film.

12. The method of claim 11, wherein said method comprises temporarily bonding said semiconductor element or said substrate or lead frame to the thermosetting die bonding film.

13. The method of claim 11, wherein said wire bonding process is carried out by a non-heating step.

14. The method of claim 11, wherein said thermosetting die bonding film has a shearing adhesive strength of 0.2 MPa or more.

15. The method of claim 11, wherein said semiconductor element is thermally set to said substrate or lead frame through the thermosetting die bonding film at a temperature of 80 to 180° C. for 0.1 to 24 hours.

* * * * *

UNITED STATES PATENT AND TRADEMARK OFFICE
CERTIFICATE OF CORRECTION

PATENT NO.       : 7,611,926 B2                                              Page 1 of 1
APPLICATION NO.  : 12/040775
DATED            : November 3, 2009
INVENTOR(S)      : Naohide Takamoto et al.

It is certified that error appears in the above-identified patent and that said Letters Patent is hereby corrected as shown below:

Title Page, Item (74), under Attorney, Agent, or Firm, please delete "Knobbe," and insert --Knobbe--, therefor.

At Column 1, Line 4, please delete "2007-051 762," and insert --2007-051762--, therefor.

At Column 5, Line 30, please delete "tris-glycicylisocyanurate" and insert --tris-glycidylisocyanurate--, therefor.

At Column 8, Line 1, please delete "Mpa" and insert --MPa--, therefor.

At Column 8, Line 43, after "In" please delete "the".

At Column 14, Line 57 (approximately), please delete "Rheometic" and insert --Rheometric--, therefor.

At Column 15, Line 14 (approximately), please delete "(Pa • s)" and insert --(Pa•s)--, therefor.

At Column 15, Line 31 (approximately), please delete "(Pa • s)" and insert --(Pa•s)--, therefor.

At Column 15, Line 53, in Claim 2, please delete "set," and insert --set--, therefor.

At Column 16, Line 11, in Claim 6, please delete "component" and insert --component,--, therefor.

At Column 16, Line 19 (approximately), in Claim 8, please delete "thermo setting" and insert --thermosetting--, therefor.

At Column 16, Line 24 (approximately), in Claim 9, please delete "thermosefting" and insert --thermosetting--, therefor.

At Column 16, Line 27 (approximately), in Claim 10, please delete "thermo setting" and insert --thermosetting--, therefor.

Signed and Sealed this

Sixteenth Day of November, 2010

David J. Kappos
*Director of the United States Patent and Trademark Office*